(12) United States Patent
Gao et al.

(10) Patent No.: US 7,800,868 B2
(45) Date of Patent: Sep. 21, 2010

(54) MAGNETIC SENSING DEVICE INCLUDING A SENSE ENHANCING LAYER

(75) Inventors: Zheng Gao, Savage, MN (US); Brian W. Karr, Savage, MN (US); Song Xue, Edina, MN (US); Eric L. Granstrom, Golden Valley, MN (US); Khuong T. Tran, Fridley, MN (US); Yi X. Li, Savage, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 1313 days.

(21) Appl. No.: 11/305,778

(22) Filed: Dec. 16, 2005

(65) Prior Publication Data

US 2007/0139827 A1 Jun. 21, 2007

(51) Int. Cl.
*G11B 5/33* (2006.01)
*G11B 5/127* (2006.01)

(52) U.S. Cl. ................ 360/324.12; 360/324.2

(58) Field of Classification Search ............ 360/324.12, 360/324.2
See application file for complete search history.

(56) References Cited

U.S. PATENT DOCUMENTS

| 6,127,045 | A | * | 10/2000 | Gill | 428/611 |
|---|---|---|---|---|---|
| 6,600,184 | B1 | | 7/2003 | Gill | |
| 6,674,617 | B2 | | 1/2004 | Gill | |
| 6,870,716 | B2 | | 3/2005 | Gill | |
| 2002/0006020 | A1 | * | 1/2002 | Hasegawa | 360/324.2 |
| 2002/0051897 | A1 | * | 5/2002 | Saito et al. | 428/692 |
| 2002/0097534 | A1 | * | 7/2002 | Sun et al. | 360/324.2 |
| 2002/0126427 | A1 | * | 9/2002 | Gill | 360/324.12 |
| 2004/0057164 | A1 | * | 3/2004 | Parker et al. | 360/324.11 |
| 2005/0002132 | A1 | * | 1/2005 | Gill | 360/324.12 |
| 2005/0195534 | A1 | * | 9/2005 | Gill | 360/324.12 |
| 2006/0098354 | A1 | * | 5/2006 | Parkin | 360/324.2 |
| 2007/0111332 | A1 | * | 5/2007 | Zhao et al. | 438/3 |

* cited by examiner

*Primary Examiner*—Brian E Miller
*Assistant Examiner*—Adam B Dravininkas
(74) *Attorney, Agent, or Firm*—Kinney & Lange, P.A.

(57) ABSTRACT

A magnetic sensor includes a sensor stack having a first magnetic portion, a second magnetic portion, and a barrier layer between the first magnetic portion and the second magnetic portion. At least one of the first magnetic portion and the second magnetic portion includes a multilayer structure having a first magnetic layer having a positive magnetostriction adjacent to the barrier layer, a second magnetic layer, and an intermediate layer between the first magnetic layer and the second magnetic layer. The magnetic sensor has an MR ratio of at least about 80% when the magnetic sensor has a resistance-area (RA) product of about $1.0\ \Omega\cdot\mu m^2$.

4 Claims, 2 Drawing Sheets

US 7,800,868 B2

MAGNETIC SENSING DEVICE INCLUDING A SENSE ENHANCING LAYER

BACKGROUND OF THE INVENTION

The present invention relates to magnetic sensors. More particularly, the present invention relates to a magnetic sensor including a tunneling barrier and a layer to improve the sensitivity of the sensor.

In an electronic data storage and retrieval system, a magnetic recording head typically includes a reader portion having a sensor for retrieving magnetically encoded information stored on a magnetic disc. Magnetic flux from the surface of the disc causes rotation of the magnetization vector of a sensing layer or layers of the sensor, which in turn causes a change in the electrical properties of the sensor. The sensing layers are often called free layers, since the magnetization vectors of the sensing layers are free to rotate in response to external magnetic flux. The change in the electrical properties of the sensor may be detected by passing a current through the sensor and measuring a voltage across the sensor. Depending on the geometry of the device, the sense current may be passed in the plane (CIP) of the layers of the device or perpendicular to the plane (CPP) of the layers of the device. External circuitry then converts the voltage information into an appropriate format and manipulates that information as necessary to recover information encoded on the disc.

An essential structure in contemporary read heads is a thin film multilayer structure containing ferromagnetic material that exhibits some type of magnetoresistance (MR), such as tunneling magnetoresistance (TMR). A typical TMR sensor configuration includes a multilayered structure formed of an insulating thin film, or barrier layer, positioned between a synthetic antiferromagnet (SAF) and a ferromagnetic free layer, or between two ferromagnetic free layers. The barrier layer is thin enough to allow electron tunneling between the magnetic layers. The tunneling probability of an electron incident on the barrier layer from one magnetic layer depends on the character of the electron wave function and the spin of the electron relative to the magnetization direction in the other magnetic layer. As a result, the resistance of the TMR sensor depends on the relative orientations of the magnetization of the magnetic layers, exhibiting a minimum for a configuration in which the magnetizations of the magnetic layers are parallel and a maximum for a configuration in which the magnetizations of the magnetic layers are anti-parallel.

Some TMR sensors incorporate a barrier layer including magnesium oxide (MgO), which allows for magnetoresistive ratios approaching 200% when the resistance-area (RA) product of the TMR sensor is high (i.e., greater than 10 $\Omega \cdot \mu m^2$). In order to achieve a high magnetoresistive ratio, a CoFeB based single free layer adjacent to the insulating thin film is sometimes used in conjunction with a high temperature anneal (i.e., greater than 300° C.). However, this device results in a high positive magnetostriction, a high RA product, and a high temperature anneal, all of which either reduce performance of the device or make processing of such a device difficult. To reduce the magnetostriction of the device, the CoFeB free layer may be laminated or co-sputtered with a material having a negative magnetostriction. While this results in a sensor having low magnetostriction, the magnetoresistive ratio of the sensor is significantly reduced.

BRIEF SUMMARY OF THE INVENTION

The present invention is a magnetic sensor including a sensor stack having a first magnetic portion, a second magnetic portion, and a barrier layer between the first magnetic portion and the second magnetic portion. At least one of the first magnetic portion and the second magnetic portion includes a multilayer structure having a first magnetic layer having a positive magnetostriction adjacent to the barrier layer, a second magnetic layer, and an intermediate layer between the first magnetic layer and the second magnetic layer. The magnetic sensor has an MR ratio of at least about 80% when the magnetic sensor has a resistance area (RA) product of about 1.0 $\Omega \cdot \mu m^2$.

DETAILED DESCRIPTION

Figure 1:
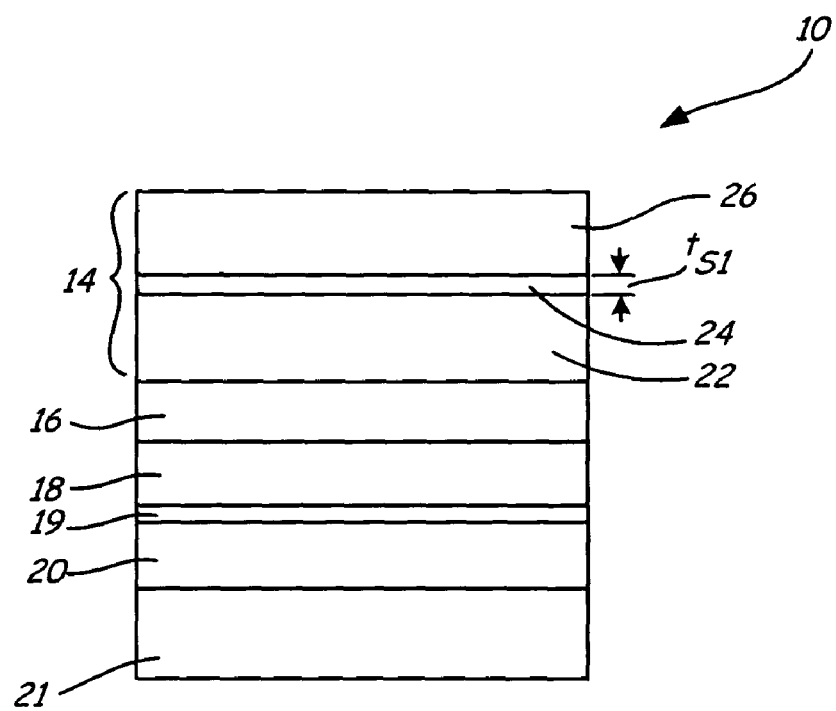
FIG. 1 is a layer diagram of a magnetic sensor including a multilayer free layer having a sense enhancing layer.

FIG. 1 is a layer diagram of a magnetic sensor 10, which includes free layer 14, barrier layer 16, reference layer 18, coupling layer 19, pinned layer 20, and pinning layer 21. Free layer 14 includes first ferromagnetic layer 22, sense enhancing layer 24, and second ferromagnetic layer 26. In one embodiment, magnetic sensor 10 is positioned between two electrodes or shields in a magnetic recording head. Magnetic sensor 10 may also include additional layers, such as a seed layer to promote growth of subsequent layers in magnetic sensor 10, and a cap layer to vary properties of magnetic sensor 10 such as resistance-area (RA) product and magnetoresistive (MR) ratio. It should be noted that the configuration of magnetic sensor 10 is merely illustrative, and other layer configurations for magnetic sensor 10 may be used in accordance with the present invention. For example, a second free layer may be substituted for reference layer 18 to form a tri-layer type magnetic sensor. In addition, while a bottom type sensor configuration is depicted in FIG. 1, the layers of magnetic sensor 10 may also be configured in a top type sensor configuration.

In operation, a sense current is passed through magnetic sensor 10. The sense current flows perpendicularly to the plane of the layers of magnetic sensor 10 and experiences a resistance that is proportional to the cosine of an angle formed between the magnetization direction of the free layer and the magnetization direction of the reference layer, or between the magnetization direction of the two free layers (in a tri-layer magnetic sensor). The voltage across the magnetic sensor 10 is then measured to determine the change in resistance and the resulting signal is used, for example, to recover the encoded information from a magnetic medium.

Free layer 14 includes first ferromagnetic layer 22, sense enhancing layer 24, and second ferromagnetic layer 26. The magnetization of free layer 14 rotates freely in response to an external magnetic field, such as a field emanating from a magnetic medium. First ferromagnetic layer 22 is positioned adjacent to barrier layer 16, and sense enhancing layer 24 is positioned between first ferromagnetic layer 22 and second ferromagnetic layer 26. First ferromagnetic layer 22 includes a material having a positive magnetostriction, such as CoFeB or CoFe based alloys, to improve the magnetoresistive ratio of magnetic sensor 10 at high (i.e., greater than 10 Ω·μm$^2$) and low (i.e., less than 4 Ω·μm$^2$) sensor resistance-area (RA) products. The ratios of each element in first ferromagnetic layer 22 may be adjusted to improve performance of magnetic sensor 10.

In order to offset the positive magnetostriction of first ferromagnetic layer 22, second ferromagnetic layer 26 is included in free layer 14 on a side opposite of sense enhancing layer 24 from first ferromagnetic material 22. Second ferromagnetic layer 26 includes a material having a negative magnetostriction and may include crystalline or amorphous ferromagnetic materials that exchange couple with first ferromagnetic layer 22. In one embodiment, second ferromagnetic layer 26 includes Ni, Ni based alloys such as NiFe, or CoFe. Second ferromagnetic layer 26 may be laminated or co-sputtered with first ferromagnetic layer 22.

Sense enhancing layer 24 is positioned between first ferromagnetic layer 22 and second ferromagnetic layer 26. Sense enhancing layer 24 significantly improves the magnetoresistive (MR) ratio of magnetic sensor 10 compared to sensors without sense enhancing layer 24. This may be because sense enhancing layer 24 separates crystalline growth of first ferromagnetic layer 22 and second ferromagnetic layer 26, preserves the interface between first magnetic layer 22 and barrier layer 16 and between first ferromagnetic layer 22 and second ferromagnetic layer 26, or prevents diffusion of component elements between first ferromagnetic layer 22 and second ferromagnetic layer 26 (thus preventing degradation of these layers).

In one embodiment, sense enhancing layer 24 is made of Ta. Sense enhancing layer 24 may also be made of other non-magnetic materials such as Ru, Zr, Hf, Nb, Mo, W, Pt, Rh, Ir, Al, Cu, Cr, Ti, or alloys thereof. In one embodiment, the thickness $t_{S1}$ of non-magnetic sensing enhancing layer 24 is in the range of about 0.5 Å to about 10 Å. Sense enhancing layer 24 may also include magnetic materials such as such as CoZrNb, CoZrTa, FeTa, FeTaN, NiFeZr, CoFeTa, CoNb, or alloys thereof. If sense enhancing layer 24 is made of a magnetic material, thickness $t_{S1}$ may be much greater than if sense enhancing layer 24 is made of a non-magnetic material.

The relative orientations of the magnetizations of first ferromagnetic layer 22 and second ferromagnetic layer 26 depend on the material and thickness of sense enhancing layer 24. That is, first ferromagnetic layer 22 and second ferromagnetic layer 26 may be ferromagnetically coupled, such that the magnetizations of the layers are aligned parallel to each other. First ferromagnetic layer 22 and second ferromagnetic layer 26 may also be antiferromagnetically coupled, such that the layers are aligned antiparallel to each other (e.g., when sense enhancing layer 26 is made of Ru and has a thickness in the range of about 4 Å to about 12 Å).

Barrier layer 16 is made of a material that permits electron tunneling between free layer 14 and reference layer 18. In one embodiment, barrier layer 16 is a layer of magnesium oxide (MgO). The MgO layer may be formed by MgO radio frequency (RF) deposition techniques or molecular beam epitaxy (MBE). The MgO layer could also be formed by oxidizing a deposited Mg layer (such as through plasma oxidation, radical oxidation, or natural oxidation). Barrier layer 16 may also include other structures, such as a Mg/MgO or MgO/Mg bilayer, a Mg/MgO/Mg trilayer, or any other laminated or multilayer structure including MgO and Mg. The thickness of barrier layer 16 is selected to balance maximizing MR ratio and minimizing the RA product of magnetic sensor 10.

Reference layer 18 comprises a ferromagnetic material, such as CoFeB. Reference layer 18 may also be made of any other type of ferromagnetic materials, including crystalline or amorphous ferromagnetic materials. Reference layer 18, coupling layer 19, and pinned layer 20 comprise a synthetic antiferromagnet (SAF) having a fixed magnetization direction. Reference layer 18 and pinned layer 20 are magnetically coupled by coupling layer 19 such that the magnetization direction of reference layer 18 is opposite to the magnetization direction of pinned layer 20. The magnetization of pinned layer 20 is pinned by exchange coupling pinning layer 21 with pinned layer 20. In one embodiment, pinned layer 20 comprises a ferromagnetic material and pinning layer 21 comprises an antiferromagnetic material. Alternatively, the SAF and pinning layer 21 may replaced by a single ferromagnetic layer having a magnetization fixed via a biasing field produced by, for example, permanent magnets (not shown) positioned adjacent to magnetic sensor 10.

Figure 2:
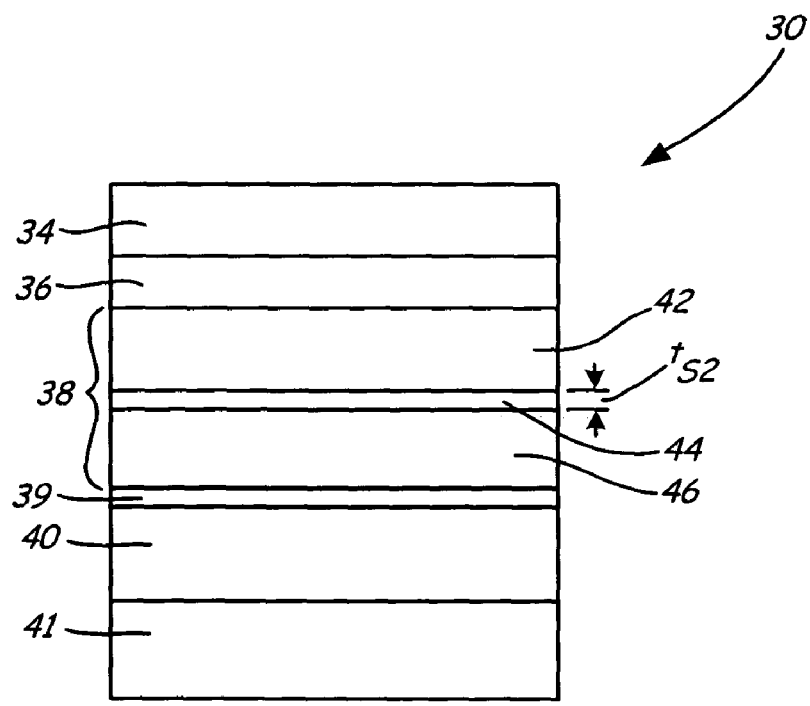
FIG. 2 is a layer diagram of a magnetic sensor including a multilayer reference layer having a sense enhancing layer.

FIG. 2 is a layer diagram of magnetic sensor 30, which includes free layer 34, barrier layer 36, reference layer 38, coupling layer 39, pinned layer 40, and pinning layer 41. Reference layer 38 includes first ferromagnetic layer 42, sense enhancing layer 44, and second ferromagnetic layer 46. In one embodiment, magnetic sensor 30 is positioned between two electrodes or shields in a magnetic recording head. Magnetic sensor 30 includes elements having similar properties as like elements in magnetic sensor 10 shown in FIG. 1. In particular, barrier layer 36, coupling layer 39, pinned layer 40, and pinning layer 41 have properties similar to barrier layer 16, coupling layer 19, pinned layer 20, and pinning layer 21, respectively, as described with regard to FIG. 1.

Free layer 34 may be a single layer of ferromagnetic material having a magnetization that rotates freely in response to an external magnetic field, such as a field emanating from a magnetic medium. In one embodiment, free layer 34 is made of CoFeB or CoFe based alloys. Alternatively, free layer 34 may be a bilayer of ferromagnetic layers such as CoFeB (adjacent to barrier layer 36) co-sputtered or laminated with Ni, a Ni based alloy, or other crystalline or amorphous ferromagnetic materials.

Reference layer 38, coupling layer 39, and pinned layer 40 comprise a SAF having a fixed magnetization direction. Reference layer 38 and pinned layer 40 are magnetically coupled by coupling layer 39 such that the magnetization direction of reference layer 38 is opposite to the magnetization direction of pinned layer 40. The magnetization of pinned layer 40 is pinned by exchange coupling pinning layer 41 with pinned layer 40.

Reference layer 38 includes first ferromagnetic layer 42, sense enhancing layer 44, and second ferromagnetic layer 46. First ferromagnetic layer 42 is positioned adjacent to barrier layer 36, and sense enhancing layer 44 is positioned between first ferromagnetic layer 42 and second ferromagnetic layer 46. First ferromagnetic layer 42 may include crystalline or amorphous ferromagnetic materials, such as CoFeB or CoFe based alloys, to improve the magnetoresistive ratio of magnetic sensor 30 at high and low sensor RA products. The ratios of each element in first ferromagnetic layer 42 may be adjusted to improve performance of magnetic sensor 30.

Second ferromagnetic layer 46 is positioned in reference layer 38 on a side opposite of sense enhancing layer 44 from first ferromagnetic material 42. Second ferromagnetic layer 46 may include any crystalline or amorphous ferromagnetic materials that exchange couple with first ferromagnetic layer 42 and have good coupling with pinned layer 40 and pinning layer 41.

Sense enhancing layer 44 is positioned between first ferromagnetic layer 42 and second ferromagnetic layer 46.

Sense enhancing layer 44 significantly improves the MR ratio of magnetic sensor 30 compared to sensors without sense enhancing layer 44. In one embodiment, sense enhancing layer 44 is made of Ta. Sense enhancing -layer 44 may also be made of other non-magnetic materials such as Ru, Zr, Hf, Nb, Mo, W, Pt, Rh, Ir, Al, Cu, Cr, Ti, or alloys thereof. In one embodiment, the thickness $t_{S2}$ of non-magnetic sensing enhancing layer 44 is in the range of about 0.5 Å to about 10 Å. Sense enhancing layer 44 may also include magnetic materials such as CoZrNb, CoZrTa, FeTa, FeTaN, NiFeZr, CoFeTa, CoNb, or alloys thereof. If sense enhancing layer 44 is made of a magnetic material, thickness $t_{S2}$ may be much greater than if sense enhancing layer 44 is made of a non-magnetic material.

Figure 3:
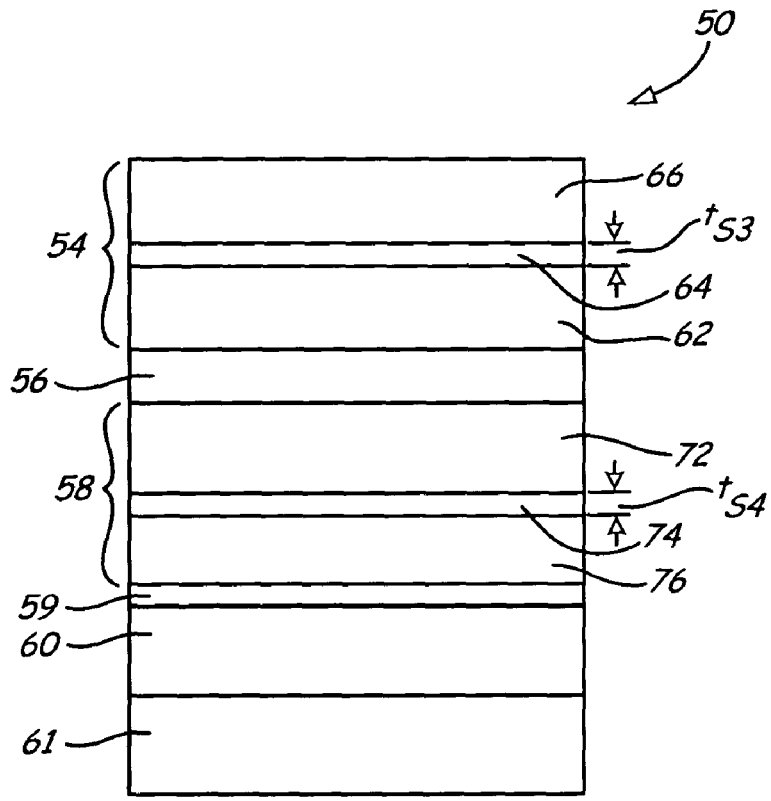
FIG. 3 is a layer diagram of a magnetic sensor including a multilayer free layer having a sense enhancing layer and a multilayer reference layer having a sense enhancing layer.

FIG. 3 is a layer diagram of a magnetic sensor 50, which includes free layer 54, barrier layer 56, reference layer 58, coupling layer 59, pinned layer 60, and pinning layer 61. Free layer 54 includes first ferromagnetic layer 62, sense enhancing layer 64, and second ferromagnetic layer 66. Reference layer 58 includes first ferromagnetic layer 72, sense enhancing layer 74, and second ferromagnetic layer 76. In one embodiment, magnetic sensor 50 is positioned between two electrodes or shields in a magnetic recording head. Magnetic sensor 50 includes elements having similar properties as like elements in magnetic sensor 10 shown in FIG. 1. In particular, barrier layer 56, coupling layer 59, pinned layer 60, and pinning layer 61 have properties similar to barrier layer 16, coupling layer 19, pinned layer 20, and pinning layer 21, respectively, as described with regard to FIG. 1.

Free layer 54 has similar configuration and properties to free layer 14 in FIG. 1. Free layer 54 includes first ferromagnetic layer 62, sense enhancing layer 64, and second ferromagnetic layer 66. The magnetization of free layer 54 rotates freely in response to an external magnetic field, such as a field emanating from a magnetic medium. First ferromagnetic layer 62 is positioned adjacent to barrier layer 56, and sense enhancing layer 64 is positioned between first ferromagnetic layer 62 and second ferromagnetic layer 66. First ferromagnetic layer 62 includes a material having a positive magnetostriction, such as CoFeB or CoFe based alloys, to improve the magnetoresistive ratio of magnetic sensor 50 at high and low sensor resistance-area (RA) products. The ratios of each element in first ferromagnetic layer 62 may be adjusted to improve performance of magnetic sensor 50.

Second ferromagnetic layer 66 is made of a material having a negative magnetostriction and is included in free layer 54 on a side opposite of sense enhancing layer 64 from first ferromagnetic material 62. Second ferromagnetic layer 66 may include crystalline or amorphous ferromagnetic materials that exchange couple with first ferromagnetic layer 62. In one embodiment, second ferromagnetic layer 66 includes Ni, Ni based alloys such as NiFe, or CoFe. Second ferromagnetic layer 66 may be laminated or co-sputtered with first ferromagnetic layer 62.

Sense enhancing layer 64 is positioned between first ferromagnetic layer 62 and second ferromagnetic layer 66. Sense enhancing layer 64 significantly improves the MR ratio of magnetic sensor 50 compared to sensors without sense enhancing layer 64 (as will be described in more detail with regard to FIG. 4). In one embodiment, sense enhancing layer 64 is made of Ta. Sense enhancing layer 64 may also be made of other non-magnetic materials such as Ru, Zr, Hf, Nb, Mo, W, Pt, Rh, Ir, Al, Cu, Cr, Ti, or alloys thereof. In one embodiment, the thickness $t_{S3}$ of non-magnetic sensing enhancing layer 64 is in the range of about 0.5 to about 10 Å. Sense enhancing layer 64 may also include magnetic materials such as CoZrNb, CoZrTa, FeTa, FeTaN, NiFeZr, CoFeTa, CoNb, or alloys thereof. If sense enhancing layer 64 is made of a magnetic material, thickness $t_{S3}$ may be much greater than if sense enhancing layer 64 is made of a non-magnetic material.

The relative orientations of the magnetizations of first ferromagnetic layer 62 and second ferromagnetic layer 66 depend on the material and thickness of sense enhancing layer 64. That is, first ferromagnetic layer 62 and second ferromagnetic layer 66 may be ferromagnetically coupled, such that the magnetizations of the layers are aligned parallel to each other. First ferromagnetic layer 62 and second ferromagnetic layer 66 may also be antiferromagnetically coupled, such that the layers are aligned antiparallel to each other (e.g., when sense enhancing layer 66 is made of Ru and has a thickness in the range of about 4 Å to about 12 Å).

Reference layer 58, coupling layer 59, and pinned layer 60 comprise a SAF having a fixed magnetization direction. Reference layer 58 and pinned layer 60 are magnetically coupled by coupling layer 59 such that the magnetization direction of reference layer 58 is opposite to the magnetization direction of pinned layer 60. The magnetization of pinned layer 60 is pinned by exchange coupling pinning layer 61 with pinned layer 60.

Reference layer 58 has similar configuration and properties to reference layer 18 in FIG. 1. Reference layer 58 includes first ferromagnetic layer 72, sense enhancing layer 74, and second ferromagnetic layer 76. First ferromagnetic layer 72 is positioned adjacent to barrier layer 56, and sense enhancing layer 74 is positioned between first ferromagnetic layer 72 and second ferromagnetic layer 76. First ferromagnetic layer 72 may include a material having a positive magnetostriction, such as CoFeB or CoFe based alloys, to improve the magnetoresistive ratio of magnetic sensor 50 at high and low sensor RA products. The ratios of each element in first ferromagnetic layer 72 may be adjusted to improve performance of magnetic sensor 50.

Second ferromagnetic layer 76 is positioned in reference layer 58 on a side opposite of sense enhancing layer 74 from first ferromagnetic material 72. The magnetostriction of reference layer 58 may be positive or negative. Thus, second ferromagnetic layer 76 may include crystalline or amorphous ferromagnetic materials that exchange couple with second ferromagnetic layer 76 and have good coupling with pinned layer 60 and pinning layer 61.

Sense enhancing layer 74 is positioned between first ferromagnetic layer 72 and second ferromagnetic layer 76. Sense enhancing layer 74 significantly improves the MR ratio of magnetic sensor 50 compared to sensors without sense enhancing layer 74 (as will be described in more detail with regard to FIG. 4). In one embodiment, sense enhancing layer 74 is made of Ta. Sense enhancing layer 74 may also be made of other non-magnetic materials such as Ru, Zr, Hf, Nb, Mo, W, Pt, Rh, Ir, Al, Cu, Cr, Ti, or alloys thereof. In one embodiment, the thickness $t_{S4}$ of non-magnetic sensing enhancing layer 74 is in the range of about 0.5 to about 10 Å. Sense enhancing layer 74 may also include magnetic materials such as CoZrNb, CoZrTa, FeTa, FeTaN, NiFeZr, CoFeTa, CoNb, or alloys thereof. If sense enhancing layer 74 is made of a magnetic material, thickness $t_{S4}$ may be much greater than if sense enhancing layer 74 is made of a non-magnetic material.

The magnetic sensors shown and described with regard to FIGS. 1-3 can be fabricated using a low temperature anneal (i.e., approximately 250° C.). The resulting device is thermally stable up to at least 300° C. and, in a sensor having an RA product of about 1.0 $\Omega \cdot \mu m^2$, has a breakdown voltage in excess of 300 mV. In addition, magnetic sensors according to the present invention demonstrate significantly improved MR ratios over corresponding devices without a sense enhancing layer included in the free layer or reference layer.

Figure 4:
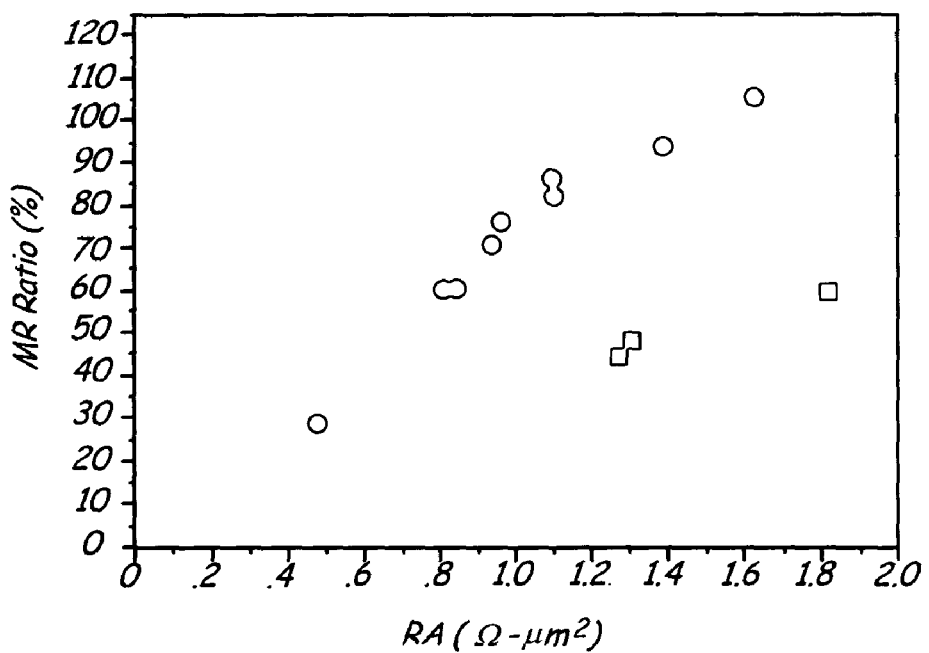
FIG. 4 is a graph of the magnetoresistive (MR) ratio versus the resistance-area (RA) product comparing the magnetic sensor of FIG. 3 with a magnetic sensor without the sense enhancing layers.

FIG. 4 is a graph of the magnetoresistive (MR) ratio versus the resistance-area (RA) product comparing magnetic sensor 50 to a comparative magnetic sensor having a similar configuration but without sense enhancing layers 64 and 74. Sense enhancing layers 64 and 74 comprised Ta in the tested magnetic sensor 50. The test data for magnetic sensor 50 is plotted on the graph with circles, while the test data for the comparative sensor is plotted on the graph with squares. Each data point represents an average value taken from multiple sensors on a wafer. As can be seen, magnetic sensor 50 achieved an MR ratio of about 100% at a sensor RA product of 1.4 $\Omega \cdot \mu m^2$, about 75% at a sensor RA product of 1.0 $\Omega \cdot \mu m^2$, about 60% at a sensor RA product of 0.8 $\Omega \cdot \mu m^2$, and about 30% at RA product of 0.5 $\Omega \cdot \mu m^2$. Magnetic sensor 50 demonstrates a nearly 100% improvement in MR ratio relative to comparative sensors having a similar RA product (down to 0.5 $\Omega \cdot \mu m^2$). Thus, magnetic sensors according to the present invention achieve improved MR ratios well into the range of RA products suitable for magnetic recording head applications (i.e., less than 4.0 $\Omega \cdot \mu m^2$), especially in recording applications beyond a 300 Gbit/in$^2$ recording area density.

In summary, the present invention is a magnetic sensor including a sensor stack having a first magnetic portion, a second magnetic portion, and a barrier layer between the first magnetic portion and the second magnetic portion. At least one of the first magnetic portion and the second magnetic portion includes a multilayer structure having a first magnetic layer having a positive magnetostriction adjacent to the barrier layer, a second magnetic layer, and an intermediate layer between the first magnetic layer and the second magnetic layer. The magnetic sensor has an MR ratio of at least about 80% when the magnetic sensor has a resistance area (RA) product of about 1.0 $\Omega \cdot \mu m^2$. Magnetic sensors according to the present invention may be fabricated using a low temperature anneal, are thermally stable beyond 300° C., have a negative magnetostriction, have a high breakdown voltage, and demonstrate high MR ratios at low sensor RA products.

Although the present invention has been described with reference to preferred embodiments, workers skilled in the art will recognize that changes may be made in form and detail without departing from the spirit and scope of the invention. For example, while the magnetic sensors according to the present invention have been described in the context of magnetic recording head applications, it will be appreciated that the magnetic sensors may be used in a variety of other applications, including magnetic random access memory applications.

The invention claimed is:

1. A magnetoresistive (MR) sensor having improved sensitivity comprising:
    a first magnetic structure;
    a MgO barrier layer adjacent to the first magnetic structure; and
    a second magnetic structure adjacent to the MgO barrier layer on a side opposite the first magnetic structure, the second magnetic structure including a positive magnetostriction layer adjacent to the barrier layer, a negative magnetostriction layer, and a sense enhancing layer between the positive magnetostriction layer and the negative magnetostriction layer,
    wherein the second magnetic structure comprises one of a free layer and a reference layer, and
    wherein the MR sensor is characterized by an MR ratio of (a) at least about 30% with a resistance-area (RA) product of about 0.5 $\Omega \cdot \mu m^2$, (b) at least about 50% with an RA product of about 0.8 $\Omega \cdot \mu m^2$, (c) at least about 80% with an RA product of about 1.0 $\Omega \cdot \mu m^2$, or (d) at least about 100% with an RA product of about 1.4 $\Omega \cdot \mu m^2$.

2. The magnetic sensor of claim 1, wherein the sense enhancing layer comprises a material selected from the group consisting of Ta, Ru, Zr, Hf, Nb, Mo, W, Pt, Rh, Ir, Al, Cu, Cr, Ti, CoZrNb, CoZrTa, FeTa, FeTaN, NiFeZr, CoFeTa, CoNb, and alloys thereof.

3. The magnetic sensor of claim 1, wherein the sense enhancing layer comprises a non-magnetic material and has a thickness in a range of about 0.5 Å to about 10 Å.

4. The sensor stack of claim 1, wherein the positive magnetostriction layer comprises a material selected from the group consisting of CoFeB, CoFeNiB, CoFe, and alloys thereof.

* * * * *